(12) United States Patent
Richter et al.

(10) Patent No.: US 9,871,050 B1
(45) Date of Patent: Jan. 16, 2018

(54) FLASH MEMORY DEVICE

(71) Applicant: GLOBALFOUNDRIES Inc., Grand Cayman (KY)

(72) Inventors: Ralf Richter, Radebeul (DE); Sven Beyer, Dresden (DE); Jan Paul, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/232,906

(22) Filed: Aug. 10, 2016

(51) Int. Cl.
*H01L 29/788* (2006.01)
*H01L 27/11531* (2017.01)
*H01L 27/12* (2006.01)
*H01L 27/11526* (2017.01)
*H01L 29/423* (2006.01)
*H01L 27/11521* (2017.01)

(52) U.S. Cl.
CPC .. *H01L 27/11531* (2013.01); *H01L 27/11521* (2013.01); *H01L 27/11526* (2013.01); *H01L 27/1207* (2013.01); *H01L 29/42328* (2013.01); *H01L 29/42336* (2013.01)

(58) Field of Classification Search
CPC ......... H01L 27/11531; H01L 27/11521; H01L 27/11526; H01L 27/1207; H01L 29/42328; H01L 29/42336
See application file for complete search history.

(56) References Cited

U.S. PATENT DOCUMENTS

| | | | | |
|---|---|---|---|---|
| 5,384,473 A | * | 1/1995 | Yoshikawa | H01L 21/02238 257/255 |
| 5,593,915 A | * | 1/1997 | Ohoka | H01L 21/31144 148/DIG. 12 |
| 5,994,188 A | * | 11/1999 | Disney | H01L 27/0623 148/DIG. 12 |
| 2003/0151112 A1 | * | 8/2003 | Yamada | H01L 21/76243 257/510 |

* cited by examiner

*Primary Examiner* — Mark Tornow
(74) *Attorney, Agent, or Firm* — Amerson Law Firm, PLLC

(57) ABSTRACT

A method of manufacturing a flash memory device is provided including providing a silicon-on-insulator (SOI) substrate, in particular, a fully depleted silicon-on-insulator (FDSOI) substrate, comprising a semiconductor bulk substrate, a buried oxide layer formed on the semiconductor bulk substrate and a semiconductor layer formed on the buried oxide layer and forming a memory device on the SOI substrate. Forming the flash memory device on the SOI substrate includes forming a flash transistor device and a read transistor device.

12 Claims, 4 Drawing Sheets

US 9,871,050 B1

FLASH MEMORY DEVICE

BACKGROUND OF THE INVENTION

1. Field of the Invention

Generally, the present disclosure relates to the field of integrated circuits and semiconductor devices and, more particularly, to the manufacture of flash memory devices and, more particularly, to the manufacture of flash memory devices on FDSOI substrates.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer. Moreover, in many applications, flash memory devices comprising transistor devices are needed.

A flash memory (for example, a FLASH EPROM or FLASH EEPROM) is a semiconductor device that is formed from an array of memory cells (devices), with each cell having a floating gate transistor. Flash memory chips fall into two main categories, namely, those having a so-called "NOR" architecture and those having a so-called "NAND" architecture. Data can be written to each cell within the array, but the data is erased in blocks of cells. Each floating gate transistor comprises a source, a drain, a floating gate and a control gate. The floating gate uses channel hot electrons for writing from the drain and tunneling for erasure from the source. The sources of each floating gate in each cell in a row of the array are connected to form a source line. In embedded memory solutions, memory cells are provided in the neighborhood of logic devices and are, particularly, together with the logic devices on a single (monolithic) silicon substrate. Flash memory devices are used in many applications, including hand-held computing devices, wireless telephones and digital cameras, as well as automotive applications. To enable the individual memory elements of a flash memory chip to maintain the physical state with which they have been programmed, each memory region must be isolated from its neighboring regions, typically by shallow trench isolations.

A variety of single gate and split gate solutions for embedded memory cell architectures are known in the art. FIG. 1 illustrates, for exemplary purposes, an embedded super flash cell of the prior art. The cell is formed on a semiconductor substrate 11 wherein source/drain regions 12 are formed. The cell comprises a floating gate 13, a control gate 14, an erase gate 15 and a select gate 16 formed by a word line. All gates may be made of polysilicon and they are covered by a multilayer insulation structure 17. The multilayer insulation structure 17 comprises parts of spacer structures formed on the tops and sidewalls of the gates. The floating gate 13 is formed over a floating gate oxide layer 18 and it is separated from the erase gate 15 by a tunnel oxide layer 18a that may be formed of the same material as the floating gate oxide layer 18. The control gate 14 and the floating gate 13 are separated from each other by an isolation layer 19, for example, an oxide-nitride-oxide (ONO) layer provided in order to enhance the capacitive coupling between the floating gate 13 and the control gate 14.

However, whereas flash cell integration in the context of manufacturing of field effect transistors (FETs) with silicon-oxynitride gate dielectrics can be reliably achieved, integration of flash cells in CMOS technologies used for the formation of FETs (and, for example, comprising the formation of high-k metal gate transistor devices) still poses challenging problems. Particularly, in the context of Fully Depleted Silicon-On-Insulator (FDSOI) Complementary Metal-Oxide-Semiconductor (CMOS) manufacturing techniques, co-integration of non-volatile memory cells as flash memory cells requires many additional deposition and masking steps.

FIG. 2 shows a typical semiconductor device or integrated circuit product comprising a bulk transistor device 40 and an FDSOI transistor device 50. The bulk transistor device 40 and the FDSOI transistor device 50 are isolated from each other by some form of isolation region 60. The bulk transistor device 40 is formed on a semiconductor bulk substrate 41 that provides a channel region in a top region of the bulk substrate 41. The bulk transistor device 40 comprises a polysilicon gate electrode layer 42, a metal gate electrode layer 43, a work function adjusting layer 44 and a gate dielectric layer 45 that, for example, is a high-k dielectric layer. Furthermore, the bulk transistor device 40 comprises a sidewall spacer 46 and raised source/drain regions 47.

The FDSOI transistor device 50 is formed on an SOI substrate that comprises a semiconductor bulk substrate 51, a buried oxide layer 52 formed on the semiconductor bulk substrate 51 and a semiconductor layer 53 that provides a channel region of the FDSOI transistor device 50. Further, the FDSOI transistor device 50 comprises a polysilicon gate electrode layer 54, a metal gate electrode layer 55, a work function adjusting layer 56 and a gate dielectric layer 57 that, for example, is a high-k dielectric layer. A sidewall spacer 58 is formed at sidewalls of the above-mentioned layers and raised source/drain regions 59 are formed by epitaxy on the surface of the semiconductor layer 53. The process flow of manufacturing the semiconductor device shown in FIG. 2 can be optimized with respect to the number of mask layers, etching processes, implantation processes, etc. However, in the prior art, the integration of the manufacture of flash memory devices in that process flow requires additional deposition and masking steps, thereby significantly increasing the complexity of the overall processing and manufacturing costs.

In view of the situation described above, the present disclosure provides a technique of forming a semiconductor device comprising a flash memory device integrated within (FD)SOI technologies with a reduced number of processing steps as compared to the art. In addition, a semiconductor device comprising a flash memory device formed according to a method of manufacturing in accordance with the present disclosure is provided.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the manufacturing of a semiconductor device, for example, an FDSOI semiconductor device, comprising a memory device, in particular, a non-volatile flash memory device. Due to the particular manufacturing technique disclosed herein, the formation of the memory device can be integrated in a process flow of FDSOI manufacturing.

A method of manufacturing a flash memory device is provided including providing a silicon-on-insulator (SOI) substrate, in particular, a fully depleted silicon-on-insulator (FDSOI) substrate, comprising a semiconductor bulk substrate, a buried oxide layer formed on the semiconductor bulk substrate and a semiconductor layer formed on the buried oxide layer and forming a memory device on the SOI substrate. Forming the flash memory device on the SOI substrate includes forming a flash transistor device and a read transistor device. Forming the flash transistor device includes forming a floating gate from a part of the semiconductor layer, forming an insulating layer on the floating gate and forming a control gate (program/erase gate) on the insulating layer. Forming the read transistor device includes removing a part of the semiconductor layer and a part of the buried oxide layer in a region of the SOI substrate, thereby exposing a surface of a part of the semiconductor bulk substrate, forming a gate dielectric layer (directly) on the exposed surface of the semiconductor bulk substrate and forming a gate electrode over the gate dielectric layer.

Formation of the flash memory device can be integrated in an FDSOI process flow wherein a plurality of FETs is formed. Particularly, the gates of the flash transistor device and the read transistor device may be formed in the same process step/process module used for forming high-k metal gate FETs in a logic area of the SOI substrate. Alternatively, making use of an additional gate process module, the gate of the read transistor may be formed within a poly gate/non high-k metal gate procedure.

The insulating layer may additionally be formed on sidewalls of the floating gate and the control gate may additionally be formed on sidewalls of the insulating layer. In other words, the control gate may overlap edges of the floating gate. Thereby, the tunneling through the edge regions can be enhanced and programming/erasing can, thus, be accelerated.

Moreover, a method of manufacturing a semiconductor device is provided including providing a silicon-on-insulator (SOI) substrate comprising a semiconductor bulk substrate, a buried oxide layer formed on the semiconductor bulk substrate and a semiconductor layer formed on the buried oxide layer, forming an FDSOI transistor device in a first area of the SOI substrate, forming a flash transistor device on and in the semiconductor bulk substrate in a second area of the SOI substrate that is electrically isolated from the first area, and forming a read transistor device on and in the semiconductor bulk substrate in the second area of the SOI substrate. Forming the FDSOI transistor device includes forming a high-k gate dielectric layer on the semiconductor layer and forming a metal gate layer over the high-k gate dielectric layer. Forming the flash transistor device includes forming a floating gate from a part of the semiconductor layer, forming an insulating layer on the floating gate and forming a control gate comprising a metal gate layer on the insulating layer. Forming the read transistor device includes removing a part of the semiconductor layer and a part of the buried oxide layer in a region of the SOI substrate thereby exposing a surface of a part of the semiconductor bulk substrate, forming a high-k gate dielectric layer on the exposed surface of the semiconductor bulk substrate and forming a read gate electrode over the high-k gate dielectric layer.

Furthermore, a flash memory device is provided including an (FD)SOI substrate comprising a semiconductor bulk substrate, a buried oxide layer formed on the semiconductor bulk substrate and a semiconductor layer formed on the buried oxide layer, a flash transistor device and a read transistor device. The flash transistor device includes a floating gate made of a part of the semiconductor layer, an insulating layer formed on the floating gate, as well as a control gate (program/erase gate) that is formed on the insulating layer. The read transistor device includes a gate electrode formed over a gate dielectric layer that is directly formed on a surface (an exposed surface) of the semiconductor bulk substrate.

BRIEF DESCRIPTION OF THE DRAWINGS

The disclosure may be understood by reference to the following description taken in conjunction with the accompanying drawings, in which like reference numerals identify like elements, and in which.

Figure 1:
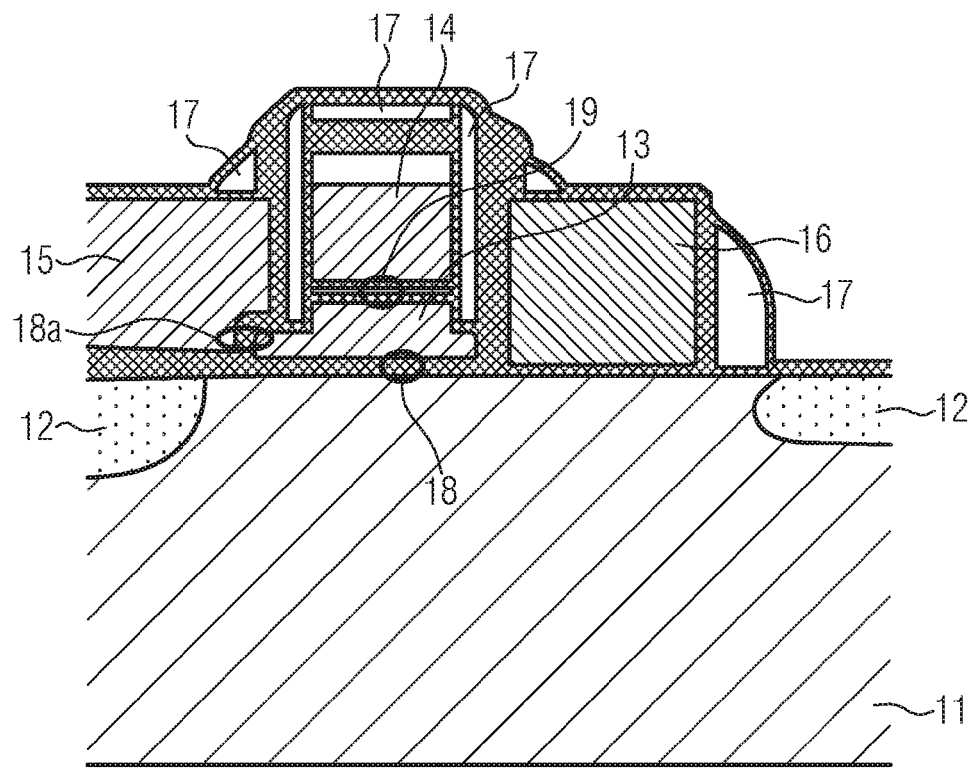
FIG. 1 illustrates a flash memory device of the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of semiconductor devices. These references are intended to be used in a manner consistent with the drawings only for teaching purposes, and are not intended as absolute references for semiconductor device structures. For example, FETs or memory devices may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

Generally, manufacturing techniques and semiconductor devices in which N-channel transistors and/or P-channel transistors and memory cells may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and nonplanar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure, generally, provides techniques for the formation of flash memory devices within (FD)SOI processing. In particular, a manufacturing technique of a flash memory device integrated in the process flow of the formation of a high-k dielectric—metal (-poly) gate FET is provided.

Figure 3:
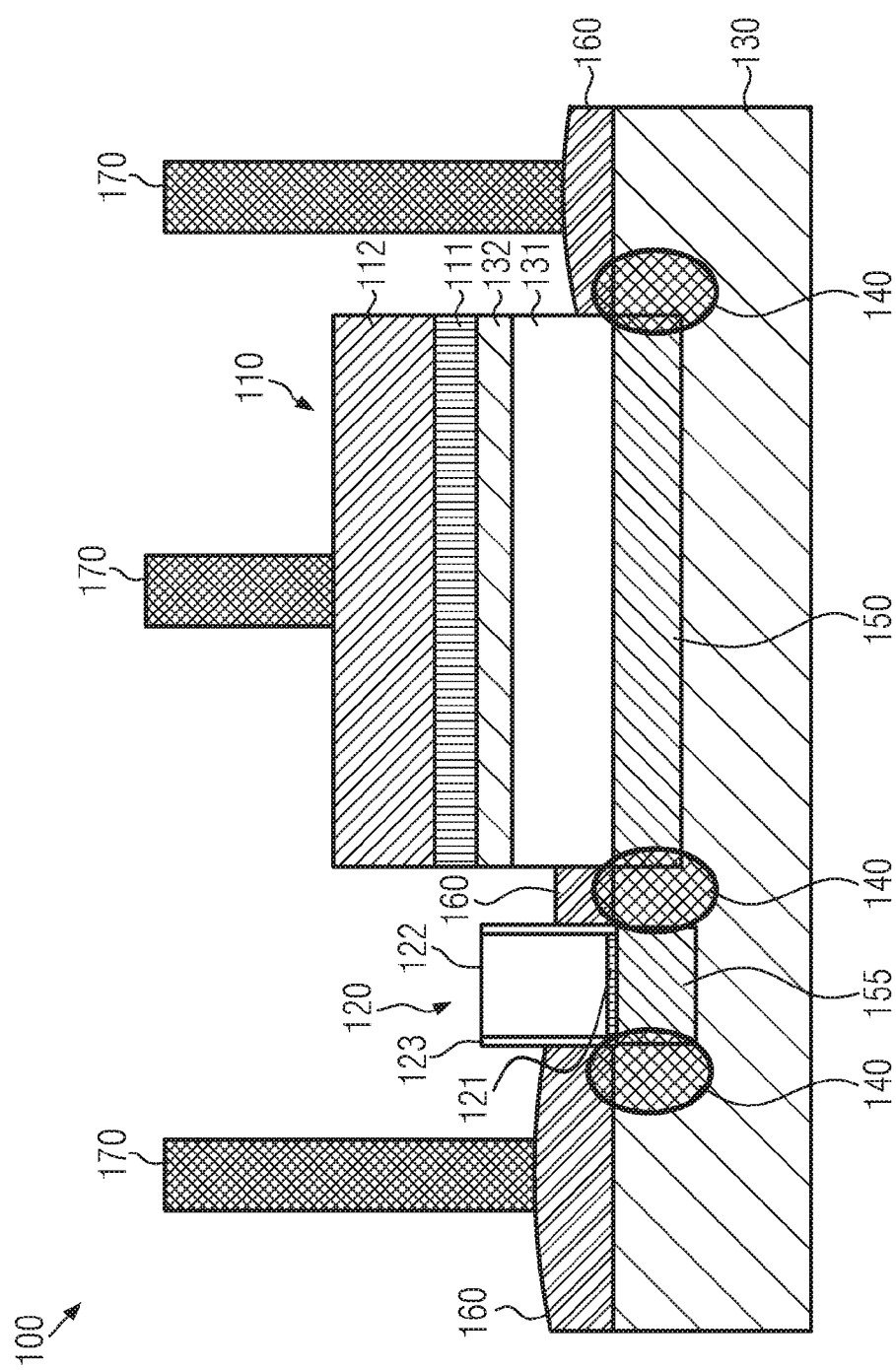
FIG. 3 shows a flash memory device comprising a flash transistor device and a read transistor device according to an example of the present disclosure.

FIG. 3 shows a flash memory device 100 comprising a flash transistor device 110 and a read transistor device 120 (connected in series to each other) according to an example of the present disclosure. The read transistor device 120 is configured to read a state (1 or 0) of the flash transistor device 110. The flash transistor device 110 and the read transistor device 120 are formed on and in an SOI substrate comprising a semiconductor bulk substrate 130, a buried oxide (BOX) layer 131 formed on the semiconductor bulk substrate 130 and a semiconductor layer 132 formed on the BOX layer 131. The semiconductor layer 132 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like.

The BOX layer 131 of the SOI substrate may comprise silicon (di)oxide or a borosilicate glass or a borophosphosilicate glass (BPSG). The BOX layer may be composed of different layers and one of the different layers may comprise BPSG or an $SiO_2$— compound comprising boron or phosphorus. The semiconductor bulk substrate 130 may provide a back gate for the flash transistor device 110. The semiconductor bulk substrate 130 may comprise or consist of silicon, in particular, single crystal silicon. Other materials may be used to form the semiconductor bulk substrate such as, for example, germanium, silicon germanium, gallium phosphate, gallium arsenide, etc. For example, the thickness of the semiconductor layer 132 may be in the range of 5-20 nm, in particular, 5-10 nm, and the thickness of the BOX layer may be in the range of 10-50 nm, in particular, 10-30 nm and, more particularly, 15-25 nm.

Both the BOX layer 131 and the semiconductor layer 132 were removed in the region where the read transistor device 120 is formed. The semiconductor layer 132 provides the floating gate of the flash transistor device 110. Isolation regions 140 are formed in the semiconductor bulk substrate 130 for electrical isolation of the flash transistor device 110 and the read transistor device 120. A well 150 is formed below the BOX layer 131 and the floating gate 132 in the semiconductor bulk substrate 130 by appropriate implantation of dopants for adjusting the threshold voltage of the flash transistor device 110. Similarly, another well 155 is formed by appropriate implantation of dopants in the semiconductor bulk substrate 130 for adjusting the threshold voltage of the read transistor device 120. Suitable dopants may include boron, arsenic and phosphorous species.

The flash transistor device 110, furthermore, comprises an insulating layer (tunneling oxide) 111 formed on the floating gate 132 and a control gate (program/erase gate) 112 formed on the insulating layer 111. The insulating layer 111 may be provided in the form of an oxide-nitride-oxide (ONO) multi-layer over the SOI substrate that is provided in order to enhance the capacitive coupling between the floating gate 132 and the control gate 112. Whereas, in the following, the insulating layer 111 is called an ONO layer, the insulating layer 111 may be made differently, for example, it may be formed of a single layer of silicon oxynitride or some oxide only.

The read transistor device 120 comprises a gate dielectric layer 121 directly formed on the semiconductor layer 130 and a gate electrode 122 formed over the gate dielectric layer 121. Moreover, a sidewall spacer 123 is formed on sidewalls of the gate electrode 122. The sidewall spacer 123 may include silicon dioxide and/or silicon nitride. The sidewall spacer 123 may be provided in the form of multilayers by subsequently epitaxially growing or depositing the respective layers on the sidewalls of the gate and appropriately etching them.

The gate dielectric layer 121 may be a high-k dielectric layer, for example, with a dielectric constant k>5, k>0 or k>13, that may comprise a transitional metal oxide, such as at least one of hafnium oxide, hafnium dioxide and hafnium silicon-oxynitride. A work function adjusting layer (not shown in FIG. 3) may be formed on the high-k dielectric layer and may comprise titanium nitride (TiN) or any other appropriate work function adjusting metal or metal oxide that is known in the art.

Both the control gate 112 of the flash transistor device 110 and the gate electrode 122 of the read transistor device 120 may comprise a metal gate layer and/or a polysilicon layer. The metal gate layer, for example, comprises a plurality of layers that may include Al, AlN or TiN. In particular, the metal gate layer may comprise a work function adjusting material that comprises an appropriate transition metal nitride, for example, those from groups 4-6 in the periodic table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm, i.e., the work function adjusting layer may be integrated in the metal gate layer.

Furthermore, raised source/drain regions 160 may be formed on the surface of the semiconductor bulk substrate 130. The flash transistor device 110 and the read transistor device 120 share one of the raised source/drain regions 160. The raised source/drain regions 160 may be formed by epitaxially growing a semiconductor material on the surface of the semiconductor bulk substrate 130. The semiconductor material may be appropriately doped during the epitaxial growth or after completion of the growth process.

The raised source/drain regions 160, the control gate 112 of the flash transistor device 110 and the gate electrode 122 of the read transistor device 120 can be electrically contacted by means of contacts 170 that may be formed on an interlayer dielectric formed over the flash transistor device 110 and the read transistor device 120. The interlayer dielectric may be made of an oxide material and it may comprise silicon dioxide. In particular, the control gate 112 can be contacted via a contact 170 to a word line. The raised source/drain regions 160 and/or the control gate 112 and/or the gate electrode 122 may be silicided in order to reduce the contact resistance.

The steps of manufacturing the configuration shown in FIG. 3 include providing an SOI substrate, removing the semiconductor layer 132 and the BOX layer 131 in a particular area of the SOI substrate, forming the gate dielectric 121 of the read transistor device 120 on the exposed surface of the semiconductor bulk substrate 130 and forming the gate electrode 122 on the gate dielectric 121. Before or after the partial removal of the semiconductor layer 132 and the BOX layer 131, implantation processes may be performed to form the wells 150 and 155. The insulating layer 111 of the flash transistor device 110 is formed on the floating gate 132 and the control electrode 112 is formed on the insulating layer 111. The formation of the different layers includes masking and etching steps in the context of conventional lithography. The masking may include the formation and structuring of a hard mask layer comprising SiN, for instance. An SiN hard mask may be used for partially removing the semiconductor layer 132 and BOX layer 131 of the SOI substrate in order to form the gate dielectric 121 of the read transistor device 120 directly on the semiconductor bulk substrate 130. The formation of the isolation regions 140 includes etching of openings into the semiconductor bulk substrate 130 and filling the openings with some isolation material, for example, comprising an oxide material.

The flash transistor device 110 and the read transistor device 120 can both be formed as N-channel or P-channel transistors. During a read operation, the read transistor device 120 is turned on. Current flow in the channel (formed in the semiconductor bulk substrate 130) depends on the charge stored in the floating gate 132 of the flash transistor device 110. Programming and erasing of the floating gate 132 is realized by Fowler-Nordheim tunneling through the insulating layer 111. If the flash transistor device 110 and the read transistor device 120 are formed as N-channel transistors, the flash transistor device 110 may represent a zero threshold voltage device. Without negative net charge present on the floating gate 132 (representing an erase state), the channel of the flash transistor device 110 (formed in the semiconductor bulk substrate 130) is in a conducting state. This state can be detected by the read transistor device 120. With negative net charge present on the floating gate 132, the threshold voltage of the flash transistor device 110 is changed to a positive value. In a read mode (i.e., no voltage is applied to the control gate 112), the read transistor device 120 detects a relatively low current (representing a programming state).

It is noted that the floating gate 132 of the flash transistor device 110 may be operated to be over-erased, i.e., it may be in a state of carrying a positive net charge. Thereby, requirements regarding zero threshold voltage can be relaxed. According to another alternative, a finite voltage may be applied to the control gate 112 during the read mode. Again, this may relax the zero voltage device requirement. As a further option, a finite voltage may be applied to the semiconductor bulk substrate 130 during programming and/or erasing and/or reading operation.

Figure 4:
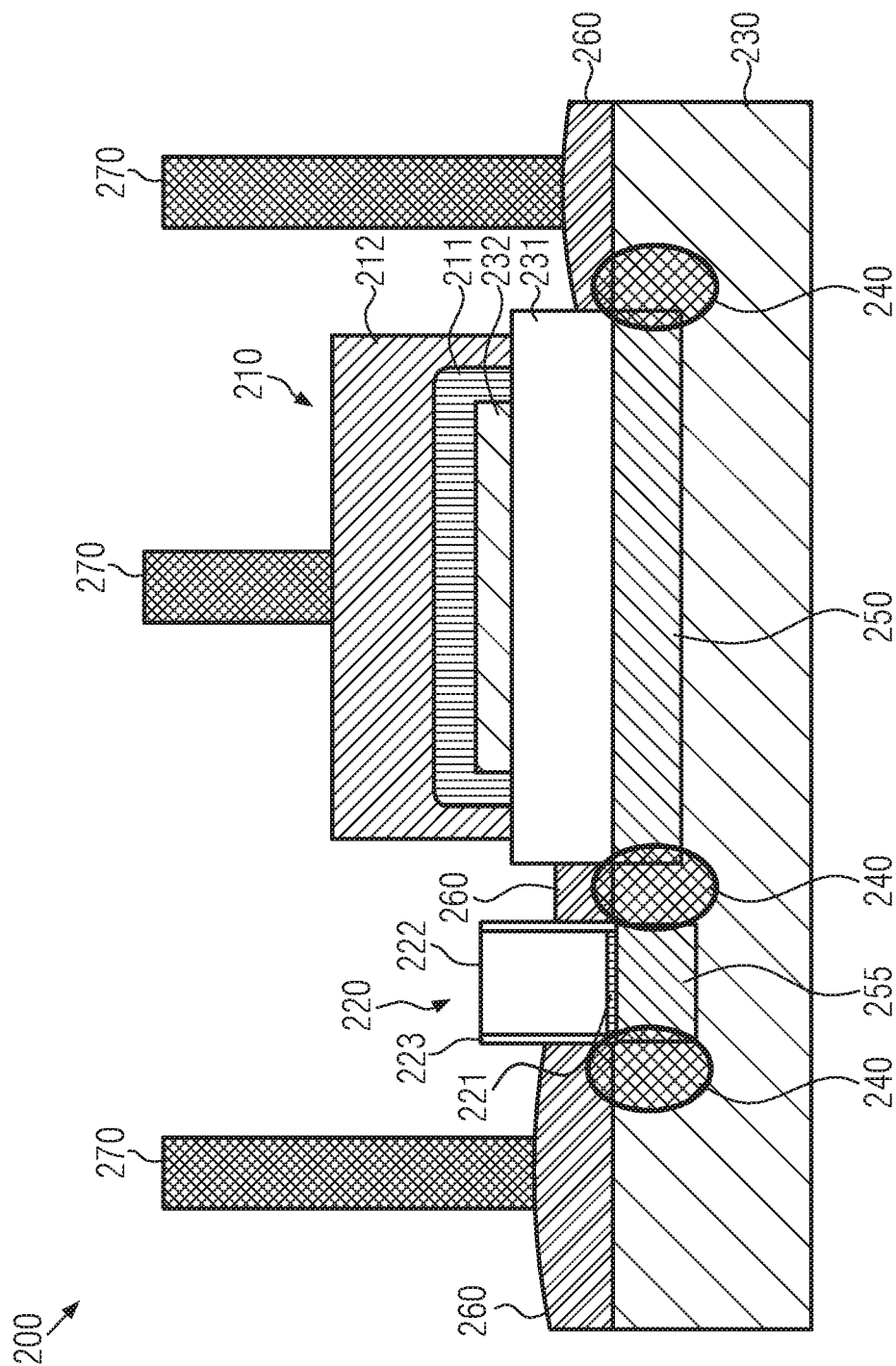
FIG. 4 shows a flash memory device comprising a flash transistor device and a read transistor device according to another example of the present disclosure.

A flash memory device 200 according to another example of the present disclosure is illustrated in FIG. 4. The flash memory device 200 comprises a flash transistor device 210 and a read transistor device 220 (connected in series to each other). The flash transistor device 210 and the read transistor device 220 are formed on and in an SOI substrate comprising a semiconductor bulk substrate 230, a buried oxide (BOX) layer 231 formed on the semiconductor bulk substrate 230 and a semiconductor layer 232 formed on the BOX layer 231. The flash transistor device 210 and the read transistor device 220 are electrically isolated by isolation regions 240. Wells 250 and 255 are respectively formed to adjust the threshold voltages of the flash transistor device 210 and the read transistor device 220.

The semiconductor layer 232 provides for the floating gate of the flash transistor device 210. An insulating layer (for example, an ONO layer) 211 is formed on the floating gate 232 and a control gate 212 is formed on the insulating layer 211. Contacts 270 are provided for electrically contacting the electrodes 212, 222. Materials and dimensions of all elements shown in FIG. 4 can be chosen as described above with reference to the example shown in FIG. 3.

The configuration shown in FIG. 4 only differs from the one shown in FIG. 3 by the arrangement of the insulating layer 211 and the control electrode 212 with respect to the floating gate 232. In fact, the insulating layer 211 and the control electrode 212 overlap edges of the floating gate 232 and they are formed on sidewalls of the floating gate 232.

Thereby, tunneling may be improved and, thus, the programming/erasing operation of the control electrode 212 may be accelerated.

Figure 2:
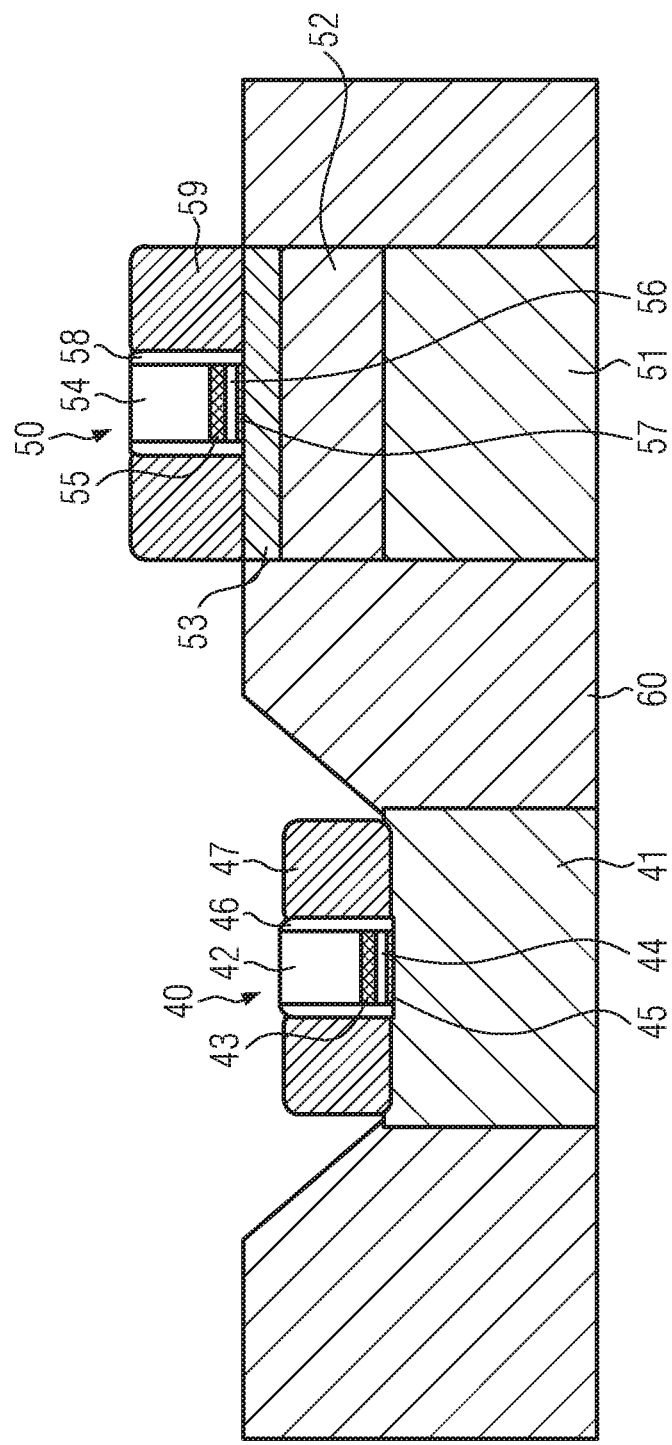
FIG. 2 illustrates an SOI semiconductor device of the prior art that comprises a bulk transistor and an FDSOI transistor.

The above-described manufacturing of a flash memory device may be readily integrated in the process flow of manufacturing FDSOI semiconductor devices (as, for example, the semiconductor device comprising a bulk transistor and an FDSOI transistor shown in FIG. 2). In particular, the control electrode 112, 212 of the flash transistor device 110, 210 and the gate electrode 122, 222 of the read transistor device 210, 220 may be formed in the same process module used for the high-k metal gate manufacturing of FETs in other areas of the die. All of the gate electrodes may be formed of the same material in the same processing step. In this case, only an additional module for the formation of the insulating layer (ONO layer) 111, 211 is needed to enable the manufacture of a flash memory device 110, 210 on an FDSOI platform used for manufacturing of FETs used as logic control elements like switches. The gate electrode 122, 222 of the read transistor device 210, 220 can alternatively be formed by an additional poly/non-high-k metal gate module.

As a result, the present disclosure provides techniques for the integration of the formation of a memory device, in particular, a flash memory device, in the (FD)SOI manufacturing process flow of FETs and it also provides semiconductor devices comprising flash memory devices. The flash memory device may be part of a NOR or NAND flash memory cell. The (FD)SOI manufacturing of reliably operating semiconductor devices comprising memory cells and logic devices may be significantly improved as compared to the art, since the number of additional deposition and masking steps needed for the formation of the memory device is significantly reduced. Particularly, the memory device may comprise a semiconductor layer of an (FD)SOI substrate as a floating gate. The disclosed devices can suitably be produced in the context of advanced 22 nm technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a flash memory device, comprising
providing a silicon-on-insulator (SOI) substrate comprising a semiconductor bulk substrate, a buried oxide layer formed on said semiconductor bulk substrate and a semiconductor layer formed on said buried oxide layer;
forming a flash transistor device on and in said semiconductor bulk substrate; and
forming a read transistor device on and in said semiconductor bulk substrate;
wherein forming said flash transistor device comprises forming a floating gate from a part of said semiconductor layer, forming an insulating layer on said floating gate and forming a control gate on said insulating layer; and
forming said read transistor device comprises removing a part of said semiconductor layer and a part of said buried oxide layer in a region of said SOI substrate, thereby exposing a surface of a part of said semiconductor bulk substrate, forming a gate dielectric layer on said exposed surface of said semiconductor bulk substrate and forming a gate electrode over said gate dielectric layer.

2. The method of claim 1, further comprising forming said insulating layer on sidewalls of said floating gate and forming said control gate on sidewalls of said insulating layer.

3. The method of claim 1, wherein said insulating layer is an oxide-nitride-oxide multi-layer.

4. The method of claim 1, further comprising forming an additional transistor device in a logic area of said SOI substrate and wherein a gate electrode of said additional transistor device and said control gate of said flash transistor device are formed in a same process module of a manufacturing tool.

5. The method of claim 4, wherein said gate electrode of said read transistor device is formed in said same process module.

6. The method of claim 1, further comprising forming a back gate of said flash transistor device in said semiconductor bulk substrate.

7. The method of claim 1, further comprising adjusting a threshold voltage of said flash transistor device by doping said semiconductor bulk substrate through said buried oxide layer and said semiconductor layer.

8. The method of claim 1, further comprising adjusting a threshold voltage of said read transistor device by doping said semiconductor bulk substrate through said buried oxide layer and said semiconductor layer before removing said part of said semiconductor layer and said part of said buried oxide layer in said region of said SOI substrate or by doping said semiconductor bulk substrate after removing said part of said semiconductor layer and said part of said buried oxide layer in said region of said SOI substrate.

9. A method of forming a semiconductor device, comprising
providing a silicon-on-insulator (SOI) substrate comprising a semiconductor bulk substrate, a buried oxide layer formed on said semiconductor bulk substrate and a semiconductor layer formed on said buried oxide layer;
forming a fully depleted silicon-on-insulator (FDSOI) transistor device in a first area of said SOI substrate;
forming a flash transistor device on and in said semiconductor bulk substrate in a second area of said SOI substrate that is electrically isolated from said first area; and
forming a read transistor device on and in said semiconductor bulk substrate in said second area of said SOI substrate;
wherein forming said FDSOI transistor device comprises forming a high-k gate dielectric layer on said semiconductor layer and forming a metal gate layer over said high-k gate dielectric layer;

wherein forming said flash transistor device comprises forming a floating gate from a part of said semiconductor layer, forming an insulating layer on said floating gate and forming a control gate comprising a metal gate layer on said insulating layer; and wherein forming said read transistor device comprises removing a part of said semiconductor layer and a part of said buried oxide layer in a region of said SOI substrate, thereby exposing a surface of a part of said semiconductor bulk substrate, forming a high-k gate dielectric layer on said exposed surface of said semiconductor bulk substrate and forming a read gate electrode over said high-k gate dielectric layer.

10. The method of claim 9, wherein at least one of said control gate of said flash transistor device and said read gate electrode of said read transistor device is formed concurrently with the formation of said metal gate layer of said FDSOI transistor device in a same processing step and of a same material as a material of said metal gate layer.

11. The method of claim 9, wherein said high-k dielectric layer of said read transistor device is formed concurrently with the formation of said high-k dielectric layer of said FDSOI transistor device and of a same material as said high-k dielectric layer of said FDSOI transistor device.

12. The method of claim 9, further comprising forming said insulating layer on sidewalls of said floating gate and forming said control gate on sidewalls of said insulating layer.

* * * * *